United States Patent [19]
Fitzgerald et al.

[11] Patent Number: 6,039,803
[45] Date of Patent: Mar. 21, 2000

[54] UTILIZATION OF MISCUT SUBSTRATES TO IMPROVE RELAXED GRADED SILICON-GERMANIUM AND GERMANIUM LAYERS ON SILICON

[75] Inventors: Eugene A. Fitzgerald, Windham, N.H.; Srikanth B. Samavedam, Cambridge, Mass.

[73] Assignee: Massachusetts Institute of Technology, Cambridge, Mass.

[21] Appl. No.: 08/806,741

[22] Filed: Feb. 27, 1997

Related U.S. Application Data

[60] Provisional application No. 60/020,820, Jun. 28, 1996.

[51] Int. Cl.⁷ .................................................. C30B 25/18
[52] U.S. Cl. ........................ 117/89; 117/101; 117/102; 117/902; 117/939
[58] Field of Search ............................ 117/939, 89, 101, 117/102, 902

[56] References Cited

U.S. PATENT DOCUMENTS

| | | | |
|---|---|---|---|
| 4,482,422 | 11/1984 | McGinn et al. | |
| 4,553,155 | 11/1985 | Chen et al. | 357/30 |
| 4,557,794 | 12/1985 | Mc Ginn et al. | |
| 4,857,270 | 8/1989 | Maruya et al. | 372/46 |
| 4,975,387 | 12/1990 | Prokes et al. | |
| 5,034,958 | 7/1991 | Kwon et al. | 372/215 |
| 5,081,519 | 1/1992 | Nishimura | |
| 5,221,413 | 6/1993 | Brasen et al. | |
| 5,246,878 | 9/1993 | Bhat et al. | 437/133 |
| 5,273,930 | 12/1993 | Steele et al. | 117/939 |
| 5,280,493 | 1/1994 | Takiguchi et al. | 372/46 |
| 5,296,458 | 3/1994 | Himpsel | |
| 5,308,444 | 5/1994 | Fitzgerald, Jr. et al. | |
| 5,316,615 | 5/1994 | Copel et al. | |
| 5,442,205 | 8/1995 | Brasen et al. | |

FOREIGN PATENT DOCUMENTS

| 4037198 | 5/1991 | Germany . |
|---|---|---|

OTHER PUBLICATIONS

Ishiwara et al, "Epitaxial Grath of Strain Free Ge Films on Si Substrates by Solid Phase Epitaxy at Ultrahigh Pressure", Applied Physics Letters 61(19) pp. 1951–53, Oct. 19, 1992.

Journal of Metals, vol. 41, No. 4, Apr. 1989, pp. 20–24, "In Search of Low–Disclosure–Density Hetero–Expitaxial Structures", by E.A. Fitgerald.

Kuo et al., Journal of Vacuum Science and Technology, "Gas–source molecular–beam epitaxy of INGaP and GaAs on strained–relaxed $Ge_xSi_{1-x}/Si$", vol. 11, No. 3, pp. 857–860, May 1, 1993.

Xie et al, Materials Science and Engineering, "Fabrication of relaxed GeSi buffer layers on Si(100) with low threading dislocation density", Vol. B14, No. 3, pp. 332–335, Aug. 15, 1992.

Tamura et al., Journal of the Electrochemical Society, "effect of very thin Si interlayers on treading dislocation behavior in GaAs on Si", vol. 139, No. 3, pp. 865–871, Mar. 1, 1992.

Chang et al., Applied Physics Letters, "Strain relaxation of compositionally graded $In_xGa_{1-x}As$ buffer layers for modulation–doped $In_{o.3}Ga_{0.7}As/In_{0.29}al_{0.71}As$ heterostructures", vol. 60, No. 9, pp. 1129–1131, Mar. 2, 1992.

Fitzgerald et al., Journal of Vacuum Science and Technology: Part B, "Relaxed $Ge_xSi_{1-x}$ structures for III–V integration with Si and high mobility two–dimensional electron gasses in Si", vol. 10, No. 4, pp. 1807–1819, Jul. 1, 1992.

*Primary Examiner*—Robert Kunemund
*Attorney, Agent, or Firm*—Samuels, Gauthier & Stevens, LLP

[57] ABSTRACT

A method of processing semiconductor materials, including providing a monocrystalline silicon substrate having a (001) crystallographic surface orientation; off-cutting the substrate to an orientation from about 2° to about 6° offset towards the [110] direction; and epitaxially growing a relaxed graded layer of a crystalline GeSi on the substrate. A semiconductor structure including a monocrystalline silicon substrate having a (001) crystallographic surface orientation, the substrate being off-cut to an orientation from about 2° to about 6° offset towards the [110] direction; and a relaxed graded layer of a crystalline GeSi which is epitaxially grown on the substrate.

13 Claims, 9 Drawing Sheets

UTILIZATION OF MISCUT SUBSTRATES TO IMPROVE RELAXED GRADED SILICON-GERMANIUM AND GERMANIUM LAYERS ON SILICON

This application claims priority from provisional application Ser. No. 60/020,820 filed Jun. 28, 1996.

This invention was made with government support under Contract No. F49620-95-1-0312 awarded by the U.S. Air Force. The government has certain rights in the invention.

BACKGROUND OF THE INVENTION

A large lattice constant semiconductor epitaxially grown on silicon (Si) is a useful preliminary structure for microelectronics applications like III–V integration on Si and for fabricating high mobility devices. Alloys of silicon and germanium (Si—Ge) grown on Si satisfy the lattice constant requirement and have been extensively studied in the past few years. As in all lattice-mismatched systems, heteroepitaxial growth of Si—Ge/Si beyond the critical thickness generally results in the formation of misfit and associated threading dislocations. Most applications do require Si—Ge layers much thicker than that imposed by the critical thickness limit and hence, a variety of techniques have been attempted to circumvent the threading dislocation problem. One of the more successful approaches to fabricate relatively defect free Si—Ge/Si layers is the growth of relaxed graded structures. Totally relaxed Si—Ge layers with low threading dislocation densities have been successfully grown using this technique. The utility of such structures in device applications have also been demonstrated.

Such graded Si—Ge alloy layers grown on silicon substrates can be used to produce high speed field effect transistors (FETs) and as substrates for integration of compound semiconductor (III–V) based optoelectronic devices. The utility of the Si—Ge/Si layers has been proven in the above applications. By grading up to 100% Ge, it is possible to create a high lattice constant semiconductor substrate on a regular Si substrate. Such a structure can be used for growing good quality gallium arsenide (GaAs) layers since its lattice constant is closer to Ge than Si. Thus, it is one way of integrating the optoelectronics of GaAs onto conventional Si substrates.

Growing relaxed graded layers of Si—Ge substrates at approximately 800° C. is known to produce quality layers with low defect densities. Grading up to 100% Ge on conventional on-axis Si(001) substrates, however, results in large surface roughness and a high density of defects such as dislocation pile-ups.

Surface morphology and a controlled defect structure are key issues in utilizing these structures for Si integrated circuits in electronic and optoelectronic applications. The strain fields associated with the misfit dislocations lead to the characteristic cross hatch pattern on the epilayer surface in lattice mismatched heteroepitaxy. For (001) epitaxy, the cross hatch pattern occurs in form of trenches and ridges aligned along the two in-plane <110> directions. The cross hatch pattern has been observed in graded Si—Ge/Si and other lattice-mismatched systems such as $In_xGa_{1-x}As$/GaAs, GaAsP/GaAs, GaAs/Si and $Ge_xSi_{1-x}$/Si. It is noted that this cross hatch pattern is very different from the <100> oriented "surface ripples" that are observed in thin elastically strained Si—Ge(001) epitaxial films. Under typical growth conditions, the surface ripples generally have a much shorter wavelength and originate from a thermodynamic equilibrium between surface roughness and misfit-induced elastic strain.

It is known that the root mean square (rms) roughness associated with the cross hatch pattern increases with increase in the final Ge content of the graded Si—Ge layer. Surface roughness can affect carrier mobilities, if very severe like the "surface ripples", and is undesirable for lithographic processes. As will be discussed, surface roughness can also lead to defects such as dislocation pile-ups. Such defects adversely affect the electronic quality of the Si—Ge material and hence the device reliability. It is important to understand the origin and interactions of these defects with the surface morphology, in order to eliminate them or minimize their density.

For relatively low lattice mismatched heteroepitaxy on (001) substrates, growth beyond the critical thickness results in the formation of 60° misfit dislocations that form an orthogonal array along the two in-plane <110> directions at the hetero-interface. These misfit dislocations commonly have an out-of-plane Burgers vector of the type ½<101> or ½<011>. It is known that 60° dislocations can react under favorable conditions to form edge dislocations with in-plane Burgers vectors of the type ½<110>.

SUMMARY OF THE INVENTION

In accordance with the invention, (001) silicon substrates that are off-cut towards a <110> direction by 6° are used in the growth of graded Si—Ge layers. In the layers graded up to 100% Ge, there is a substantial improvement in the surface roughness and dislocation pile-up densities as compared to growth on the conventional Si(001) on-axis substrates. The present invention involves the use of miscut Si(001) substrates and obtained improved layer quality in terms of surface roughness and dislocation pile-up densities. The root mean square (rms) surface roughness measured using atomic force microscopy (AFM) shows a 75% improvement for samples graded up to 100% Ge over growth on the conventional on-axis Si(001) substrates. The dislocation pile-up densities measured using electron beam induced current (EBIC) were about an order of magnitude lower for the 100% Ge samples grown on the off-cut Si substrates as compared to growth on the on-axis Si substrates. Thus, the use of off-cut Si substrates results in a tremendous improvement in the quality of graded Ge layers grown on Si.

The reduced surface roughness translates into ease of subsequent processing for GaAs growth. A lower surface roughness also helps in easy patterning of the Ge surface for device processing. Reduced dislocation pile-up density implies that the material has improved electronic properties.

The Ge layers grown on off-cut Si(001) substrates can be used as a starting substrate material for a variety of III–V optoelectronic devices such as light emitting diodes (LEDs), semiconductor lasers, and metal semiconductor field effect transistors (MESFETs). Conventionally, such devices have been grown on expensive GaAs substrates. Alternatively, Si cannot emit light efficiently, and therefore optoelectronics has yet to become a light-volume product. Since the silicon technology is very well established, it would be very economical to produce III–V (GaAs, GaInP) based devices and Si based circuits on the same chip. The lack of reliable way of producing good quality GaAs layers on silicon substrates has been the biggest barrier in achieving the aforementioned integration. Growth of good quality Ge layers on Si will provide an inexpensive rout to produce III–V optoelectronic layers on Si substrates. It is quite likely that the future of the electronics industry will be a monolithic electronic/photonic chip based on such technology.

In accordance with one aspect of the invention, there is provided a method of processing semiconductor materials including providing a monocrystalline substrate of a first semiconductor material having a (001) crystallographic surface orientation; off-cutting the substrate to an orientation from about 1° to about 8° offset from the [001] direction; and epitaxially growing a relaxed graded layer of a crystalline second semiconductor material on the substrate, the second semiconductor material including at least the first semiconductor material.

In accordance with another aspect of the invention there is provided a method of processing semiconductor materials, including providing a monocrystalline silicon substrate having a (001) crystallographic surface orientation; off-cutting the substrate to an orientation from about 2° to about 6° offset towards the [110] direction; and epitaxially growing a relaxed graded layer of a crystalline GeSi on the substrate.

In accordance with another aspect of the invention there is provided a semiconductor structure including a monocrystalline silicon substrate having a (001) crystallographic surface orientation, the substrate being off-cut to an orientation from about 2° to about 6° offset towards the [110] direction; and a relaxed graded layer of a crystalline GeSi which is epitaxially grown on the substrate.

DETAILED DESCRIPTION OF THE ILLUSTRATED EMBODIMENTS

Figure 1A:
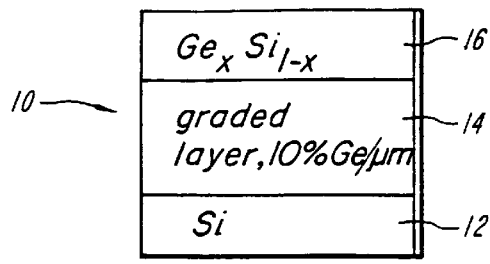
FIG. 1A is a schematic of an exemplary sample structure 10 in accordance with the present invention.

The present invention is directed to the use and effect of substrate miscut on the surface morphology and the dislocation structure in Ge/Si—Ge(graded)/Si. It will be appreciated by those of skill in the art that a criterion exists for the arrest of a threading dislocation in a strained epitaxial layer due to interaction with the stress field of an orthogonal misfit dislocation lying in its path, as described in L. B. Freund, J. Appl. Phys. 68, 2073 (1990), incorporated herein by reference. By applying the dislocation blocking criterion to graded Si—Ge structures with a rough surface, it is possible to predict the formation of dislocation pile-ups from the maximum trench depth of the cross hatch pattern. The pile-ups are not only deleterious because they contain a high threading dislocation density, but they lead to extremely rough surfaces due to stress-related growth instability.

Transmission electron microscopy (TEM) studies reveal that the orthogonal array of 60° dislocations that initially forms to relieve misfit is not the lowest energy configuration of dislocations. It has been found that in Ge rich regions of the graded Ge$_x$Si$_{1-x}$ structures, edge dislocations of the type ½<110> could further react to form dislocations with an in-plane Burgers vector of the type <100>, resulting in a lower energy hexagonal dislocation network. Such a dislocation network has not yet been characterized in lattice mismatched heteroepitaxial thin films. Such dislocation reactions occurred more easily in samples grown on the miscut substrate. The present invention shows that the favorable intersection of the {111} glide planes in the samples grown on the miscut substrates aid the dislocation reactions necessary to form this network. Miscut substrates provide a substantial improvement in the defect structure and surface morphology in Ge/Si—Ge(graded)/Si structures.

In slowly graded Si—Ge structures grown at fairly high temperatures, it has been found that the epilayers relax easily forming misfit dislocations at the interface, and hence the <100> oriented surface ripples are not observed. The predominant surface morphology effect that one observes is the <110> cross hatch pattern from the strain fields of the underlying long misfit dislocations.

It will be appreciated that with respect to the present invention, even gradual roughness such as those present in slowly graded samples, leads to the formation of dislocation pile-ups in graded buffers under prolonged relaxation. The pile-ups increase the threading dislocation density in the relaxed Ge-Si/Si structures. By growth on off-cut wafers, the surface roughness decreases drastically and the pile-up density decreases as well. It is proposed that threading dislocations are not easily blocked by non-parallel misfit dislocations. In addition, it is possible to form an alternative dislocation array to the 60° dislocation array normally present in graded relaxed mismatched heterostructures. With respect to the present invention, in Ge rich regions of the graded Ge$_x$Si$_{1-x}$ structures, a large number of edge dislocations of the type ½<110 > as well as in-plane Burgers vectors of the type <100> have been observed. Four ½<110> edge dislocations and two <100> edge dislocations lead to a lower energy hexagonal dislocation network. Such a dislocation network, first reported in bulk silver bromide crystals, has not been previously characterized in lattice mismatched heteroepitaxial thin films. The present invention suggests that favorable intersection of the {111} glide planes in exemplary samples grown on the miscut substrates aid the dislocation reactions necessary to form this network.

It will be further appreciated that the present invention shows that miscut substrates provide a substantial improvement in the defect structure and surface morphology in Ge/Si—Ge(graded)/Si structures. In addition, growth on miscut substrates encourages the formation of a hexagonal dislocation structure which may relax layers with improved surface morphologies and lower defect densities.

FIG. 1A is a schematic of an exemplary sample structure 10 in accordance with the present invention. The exemplary structure includes a (001) monocrystalline silicon substrate 12 having its crystallographic orientation off-cut to an orientation from about 1° to about 8° offset from the [001] direction, preferably having a 6° off-cut towards in-plane <110>. A relaxed graded layer 14 of a crystalline semiconductor material such as GeSi is epitaxially grown on the substrate in grade 10% Ge/μm layers, the last layer 16 of the graded layers having a desired composition of $Ge_xSi_{1-x}$, preferably until x=1. It will be appreciated that other desired III–V semiconductor materials such as GaAs and GaInP can also be utilized to produce the exemplary structure.

Exemplary epitaxial films of $Ge/Ge_xSi_{1-x}/Si$ were grown on 2 inch (001) and (001) 6° off-cut (towards in-plane <110>) n—Si substrates using ultra-high vacuum chemical vapor deposition (UHVCVD). Relaxed graded $Ge_xSi_{1-x}$ films were grown between 650–1300° C., preferably 800–900° C. The films were graded from pure Si (x=0) to pure Ge (x=1) at a constant grading rate of 10% Ge/μm. The grading rate of 10% Ge/μm was achieved by increasing the Ge content by ≈3.33% Ge in steps of ≈0.33 μm. A 1–2 μm uniform cap layer of pure Ge was grown above the graded region. The top 0.1 μm of the uniform cap layer was p-doped to create a p-i-n structure suitable for electron beam induced current (EBIC) characterization. $Ge_xSi_{1-x}/Si(001)$ films graded to 30% and 70% final Ge composition were also grown under similar growth conditions for comparison. The cap layer in each case had the same uniform Ge concentration as the final Ge % in the respective graded layers.

The surface morphology of the heterostructures was characterized using scanning electron microscopy (SEM) and atomic force microscopy (AFM). The rms roughness data was obtained from a number of 100 μm×100 μm surface scans using contact mode AFM (Nanoscope III, Digital Instruments Inc.). The maximum trench depth of the cross hatch pattern was determined by the "section analysis" routine.

The dislocation structures were characterized primarily through (001) plan view TEM. The samples for observation were prepared by mechanical polishing from the Si substrate side to about 20 μm followed by argon ion beam milling. For observing the dislocation networks near the top of the graded Si—Ge region (Ge-rich), the sample was ion-milled primarily from the substrate side until electron transparency was obtained. For characterizing the Si-rich regions of the graded Si—Ge structure, the sample was milled from both the substrate side and the epilayer side.

Electron beam inducted current (EBIC) was used to observe electrically active dislocations threading up through the uniform cap layer. The threading segments of dislocations gliding on the {111} planes can interact with stress fields of pre-existing orthogonal misfit dislocations and get trapped. Other factors like surface trenches can aid such blocking. This blocking can create dislocation pile-ups along trenches in the cross hatch pattern. These pile-ups were good recombination sites for charge carriers and showed a dark contrast along the trenches. The dislocation pile-ups are planar defects and their densities were characterized by the number of intersections per unit length of the sample surface. The density (no./cm) was determined by calculating the number of intersections of the dark contrast lines with random straight lines drawn on the EBIC micrographs.

Figure 1B:
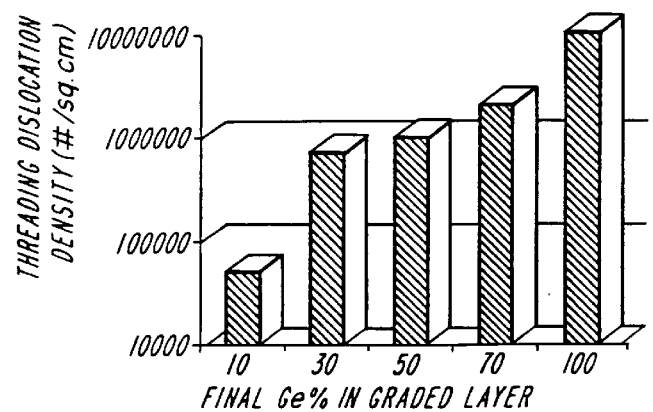
FIG. 1B is a plot showing increase in threading dislocation density with increasing final Ge % in the graded layer.

The following is a summary of the experimental data collected from the $Ge/Ge_xSi_{1-x}/Si$ films grown on off-cut and on-axis (001) Si wafers. FIG. 1B is a plot showing increase in threading dislocation density with increasing final Ge % in the graded layer. FIG. 1 shows the trend in threading dislocation density versus final Ge concentration in graded 10% Ge/μm layers. If it is desired to integrate devices on these buffers, the origin of this dislocation increase must be determined. The threading dislocation density increase can be correlated to pile-up density and surface roughness. For this constant grading rate, one does not expect an increase in threading dislocation density unless there is a decrease in average misfit dislocation length. Thus, one possibility is that dislocation interactions that arrest dislocation motion must become more probable with thicker graded layers. In addition, the increase in threading dislocation density can be correlated to surface roughness and dislocation pile-up density. In the following description, initially the observations of surface morphology and pile-up density on on-axis wafers will be discussed, followed by the effect of off-cut wafers on defect morphology.

Strain in epitaxial films is directly correlated to surface morphology. Earlier work has shown that the surface cross hatch pattern was related to misfit dislocation strain field. The strain fields associated with threading dislocations also change the surface morphology. Lattice mismatch strain itself, without the presence of dislocations, can roughen the surface if the growth temperature, sign and magnitude of the strain is adequate. The unifying theme is that any event that can produce lattice strain will induce surface roughening if the temperature is high enough to allow enough surface diffusion to approach thermodynamic equilibrium. The surface roughness due to the cross hatch pattern in graded Si—Ge structures is primarily due to strain fields arising from inhomogeneous distribution of misfit dislocations at each grading step interface. The growing surface incorporates undulations (to minimize strain energy) in response to local strain field variations.

The strain field variations from an array of misfit dislocations at each hetero-interface extend well beyond each Ge grading step (0.33 μm). Thus, the cross hatch pattern at any instant during the growth is the response of the surface to multiple overlapping strain fields. The formation of cross hatch pattern exposes higher index planes along the trenches. CVD growth subsequently leads to anisotropic growth effects and accentuates the surface roughness further.

Figure 2:
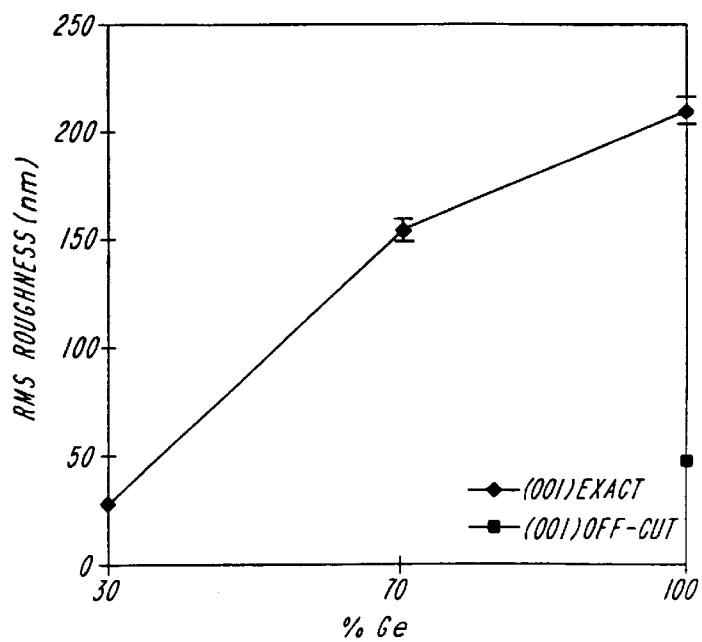
FIG. 2 is a plot showing the increase in rms surface roughness with increase in the final Ge % of the graded layer.

FIG. 2 is a plot showing the increase in rms surface roughness with increase in the final Ge % of the graded layer, and shows the effect of increasing final Ge content of the graded layer on the rms roughness of the top surface in $Ge_xSi_{1-x}/Si$ films. Since all the graded layers were grown at 10% Ge/μm, different final Ge contents imply that the graded regions in each structure are of different thicknesses. The rms roughness for each sample was obtained by averaging the height data over several 100 μm×100 μm surface scans, obtained by using the AFM in the contact mode. The roughness due to the cross hatch pattern was found to increase with final Ge content for samples grown on exact (001) oriented substrates. For the Ge/Ge$_x$Si$_{1-x}$/Si samples grown on the (001) miscut substrates (6° off towards <110>) there was a tremendous improvement in surface roughness.

There are different mechanisms which can contribute to the increased roughness observed in FIG. 2. In all low-mismatched heterostructures, the cross hatch pattern contributes to an increase in surface roughness. It has been suggested that the cross hatch pattern is primarily due to formation of surface steps produced by gliding 60° dislocations. This proposition alone, however, does not explain the increase in rms roughness of the cross hatch pattern with increase in grading rate for equally relaxed graded SiGe structures. Nor can it explain difference in cross hatch morphology (long-wavelength surface undulations) due to growth temperature. Also, the surface roughness anisotropy along the two <110> directions (for growth on the off-cut substrate) cannot be explained by the surface step argument, since dislocations are introduced in equal numbers along both <110> directions. Surface step formation by gliding dislocations could affect the cross hatch appearance in the early stages of stress relaxation in partially relaxed graded Si—Ge films. If surface diffusion is limited, for example at low growth temperatures, the steps produced by the dislocations will not migrate the distances necessary to achieve the equilibrium surface. In completely relaxed graded Si—Ge/Si structures grown at higher temperatures, where the equilibrium surface can be achieved, strain field effects from underlying misfit dislocations coupled with anisotropic growth kinetics are predominantly responsible for cross hatch formation.

Figure 3:
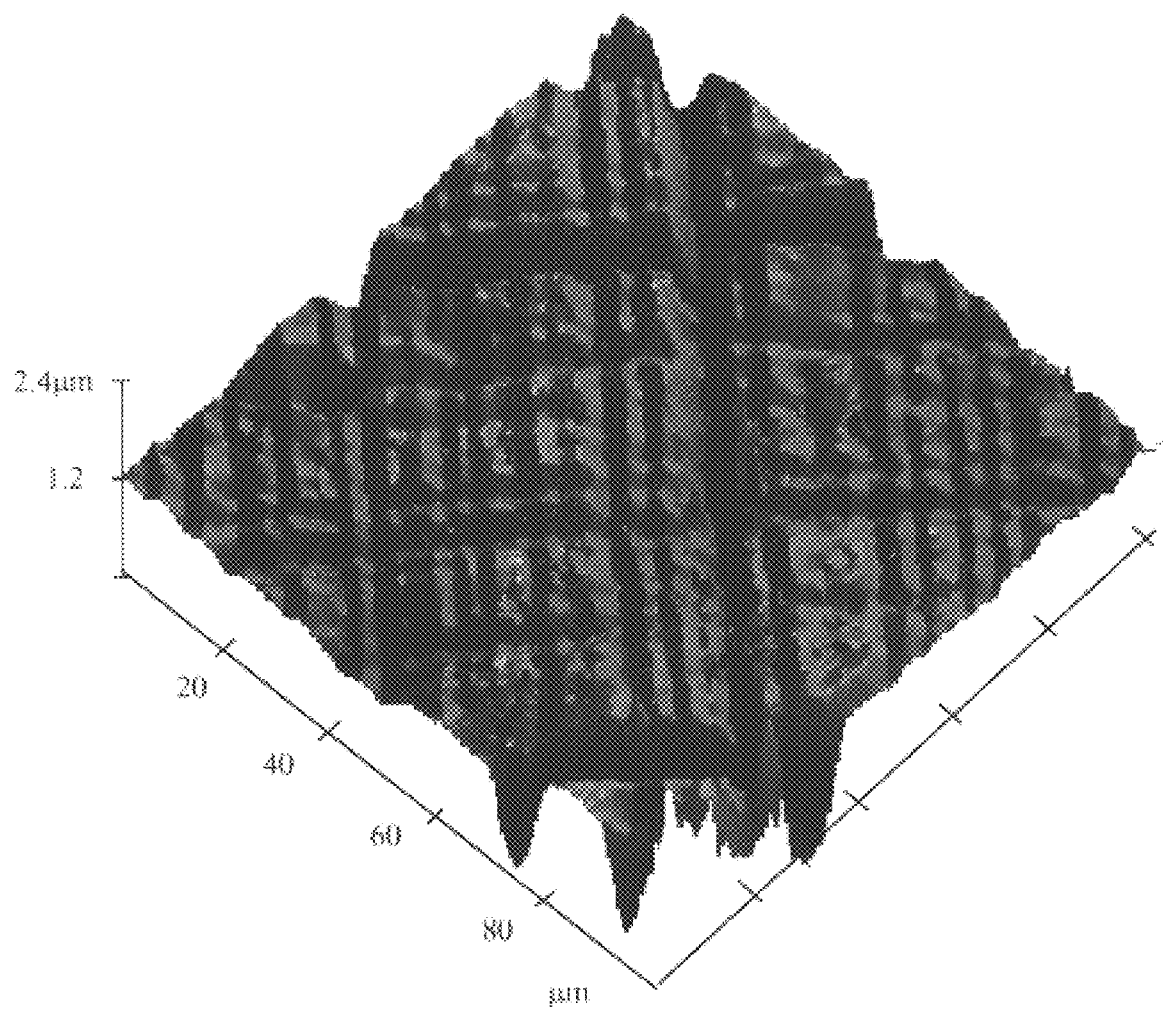
FIG. 3 is an AFM image of the surface of UHVCVD grown relaxed graded Ge-Si exemplary sample graded up to 100% Ge on a Si(001) substrate.

In layers graded gradually from Si to pure Ge an additional feature appears in CVD grown material on on-axis wafers. Rare, deep trenches are observed on the surface that accounts for increased rms roughness of the samples as shown in FIG. 3. FIG. 3 is an AFM image of the surface of UHVCVD grown relaxed graded Ge-Si exemplary sample graded up to 100% Ge on a Si(001) substrate. Deep trenches running along the two in-plane <110> directions account for the high rms roughness (≈210 nm).

Since they are absent in 10% Ge/μm graded layers grown to Ge$_{0.3}$Si$_{0.7}$, they must be related to a rare degenerative phenomenon in the relaxed graded region that occurs more frequently with increased grading rate. Previous work indicates that dislocation pile-up formation due to work hardening (dislocation interaction) in the graded buffer is likely responsible for the deep trench formation, as discussed in the next section.

The mechanisms behind the dislocation pile-up formation and the resulting trench formation that degrades the surface morphology in graded Ge$_x$Si$_{1-x}$ structures graded to high Ge concentrations will now be described. Work hardening occurs in heavily dislocated materials. In accordance with the present invention, the graded region may experience work hardening if the dislocation density becomes very high. The microscopic origin of such work hardening is dislocation interaction. In mismatched interfaces, it has been shown that a threading dislocation can be blocked by a perpendicular interface misfit dislocation, since in a single heterostructure they are confined to a single plane.

Having established the connection of the surface morphology to the pile-up density, the mechanism behind the pile-up formation is now discussed. A criterion has been proposed to explain the blocking of a gliding threading dislocation by an interface misfit dislocation in terms of background elastic mismatch strain, $\epsilon_0$, and normalized film thickness, h/b, where b is the magnitude of the Burgers vector. This model has been slightly modified and verified experimentally for isothermal anneals of uniform composition Si—Ge/Si films. Accordingly, the model and calculations are used to explain the formation of dislocation pile-ups in graded Ge$_x$Si$_{1-x}$/Si films.

Figure 4:
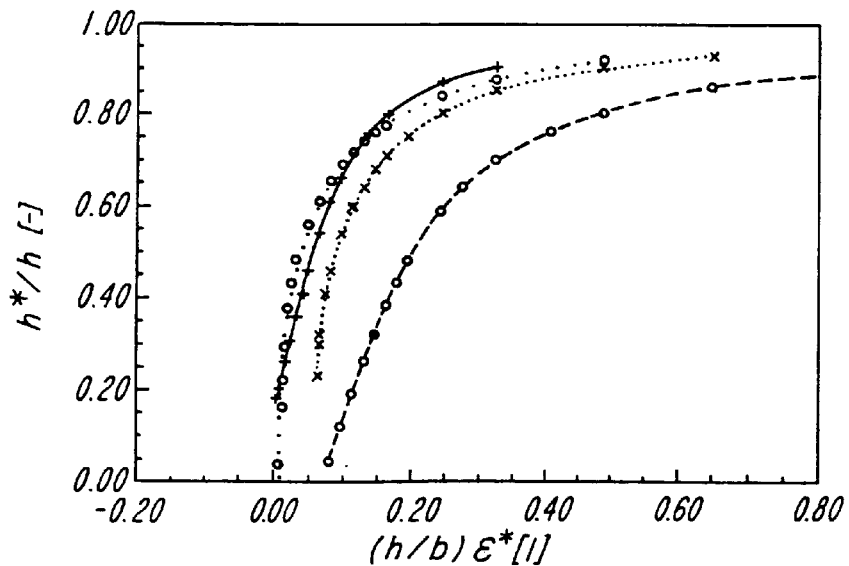
FIG. 4 is a graph showing a plot of h/h* versus (h/b)$\epsilon$*, used to calculate h*/h ratio for graded Si—Ge/Si layers.

When a threading dislocation approaches an orthogonal misfit dislocation, the effective force moving the threading dislocation is reduced by the stress field of the orthogonal misfit dislocation. The stress field from the misfit dislocation decays as ≈1/r, where r is the distance from the misfit dislocation. Thus, there is some area above the misfit dislocation where the stress field has decayed sufficiently that the force on the threading dislocation is not reduced. Therefore, a threading dislocation segment has to pass through a restricted channel, h*, formed between the surface and the decay of the misfit stress field from the interface. FIG. 4 is a graph showing a plot of h/h* versus (h/b)ε*, used to calculate h*/h ratio for graded Si—Ge/Si layers. The different curves correspond to different dislocation combinations. For the strains involved in the exemplary samples h*/h always tend to 1, irrespective of the dislocation combination chosen. FIG. 4 is plot of normalized channel width, h*/h as a function of (h/b)ε, where h is the height of the film. Referring to the plots in FIG. 4, for a background strain of $\epsilon^*$ in a film thickness of h, h* is the channel width through which a threading segment must pass to overcome the stress field of the orthogonal dislocation.

For graded Ge$_x$Si$_{1-x}$/Si structures grown at 10% Ge/μm grading rate, the equilibrium critical thickness is ≈375 nm. During growth of the graded lay=er, there is ≈375 nm of graded Ge$_x$Si$_{1-x}$/Si film at the surface that is elastically strained, at all times during the growth process. In the growth experiments, the grading rate of 10% Ge/μm was achieved by increasing the Ge content by ≈3.33% Ge in steps of ≈333 nm. Hence, each step in Ge is completely strained until the next step in concentration occurs, and the threading dislocation experiences approximately the same force as a single heterostructure 333 nm in thickness. The critical thickness is a strong function of the Ge grading rate and nearly independent of the final Ge % of the graded layer. Hence, the same critical thickness approximation can be applied to films graded to different final Ge % (at the same grading rate) in the experiments.

The background strain, $\epsilon^*$, for all films is ≈0.12% for a 3.33% Ge increase per step. For the values just stated, referring to FIG. 4, the h/h* ratio approaches unity. This h/h* means that the channel width, h*, is almost as thick as the epilayer. Thus, the gliding threading segment can easily overcome the strain field and blocking effect of orthogonal misfit dislocation. Therefore, the blocking criterion of a single perpendicular dislocation alone cannot explain the formation of dislocation pile-ups in graded Ge$_x$Si$_{1-x}$/Si structures, since at 10% Ge/μm grading rate, no blocking should occur. The blocking effect of orthogonal misfit dislocations is not large enough to counter the background strain in reasonably thick and moderately lattice-mismatched cases. To explain the formation of dislocation pile-ups in these graded structures, some other mechanism of dislocation blocking needs to be evoked.

Figure 5:
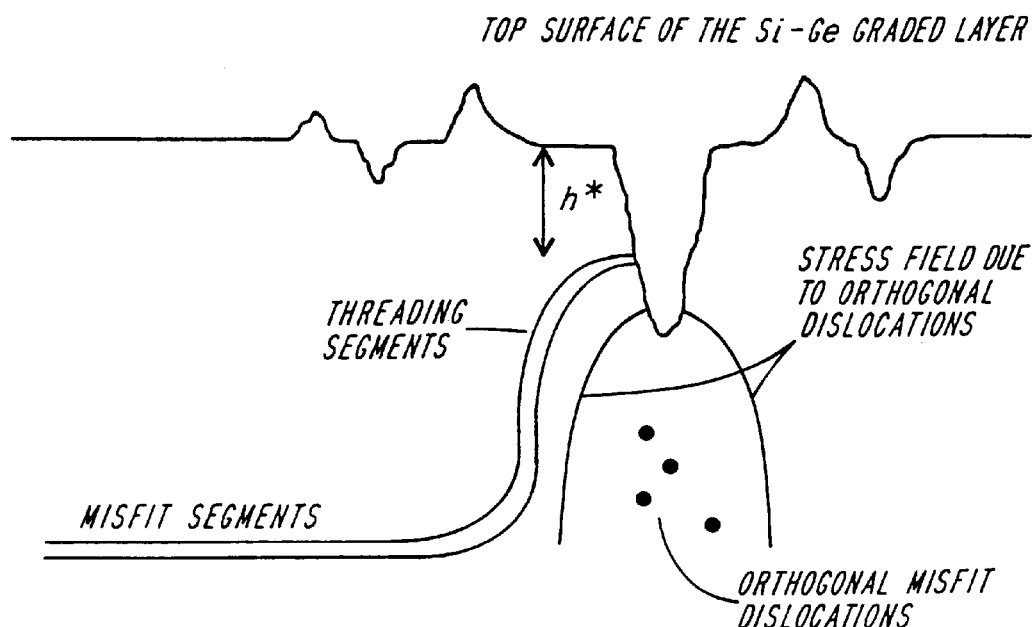
FIG. 5 is a schematic showing the gliding dislocations interacting with existing dislocations and getting blocked at the trench side-walls.

Some of the deeper, rare trenches due to the cross hatch pattern might be responsible for the blocking action of the gliding threading dislocation segments. FIG. 5 shows a schematic that explains the possible mechanism of dislocation pile-up formation in graded Ge$_x$Si$_{1-x}$/Si structures. The figure shows a threading segment of a gliding dislocation interacting and being blocked by the stress fields of pre-existing groups of orthogonal misfit dislocations. Such groups are known to exist in mismatch structures due to heterogeneous nucleation sources. The strain fields from such a group create a deeper trough in the cross-hatch pattern. With this local decrease in thickness, threading dislocations get blocked since the channel width, h*, can decrease to zero from both the depression in the surface morphology and the stress fields from the orthogonal dislocations. Following the previous terminology, the channel width, h*, is lesser than the film thickness, h, through which the threading segment has to pass. However, it is possible that the threading segment might get blocked by a surface trench that is deeper than the channel width, h*, and lying right above the orthogonal misfit dislocations as shown in the schematic (which are responsible for the trench formation initially, as described previously). Other gliding segments traveling on the same or parallel {111} planes could also be blocked by the same effect, and by previous threading dislocations which have been blocked. Such an event can lead to a dislocation pile-up along the trench.

The presence of such misfit dislocations very close to a surface trough is not unexpected. Surface depressions and deep ripple troughs have been identified to be regions with a reduced kinetic barrier to nucleation of dislocations. Such events occur when the layers are heavily elastically strained (>1%) as described previously. Recent TEM studies have revealed that there is a direct correlation between the position of troughs and individual dislocations injected to relieve misfit in InGaAs/GaAs systems. However, in slowly graded structures such sharp dislocation sources are not present initially, and the strain is nearly completely relaxed except for a small equilibrium strain at the surface. Thus, dislocation nucleation cannot be initially producing the pile-up structures.

At higher growth temperatures and continued roughening due to CVD growth, it is not inconceivable that such large surface features contribute to dislocation nucleation. In exemplary samples, with slow grading and low mismatch stress, the surface features are formed due to the stress fields of buried misfit dislocations groups. Not all surface trenches would be deeper than the channel width, h*. Thus, the blocking event and hence the dislocation pile-up formation is a rare event occurring only when the trench is deeper than h*. However, it is unlikely that all of the surface trenches that could lead to nucleation would be deeper than the channel width, h*. Thus, the blocking events must be responsible for dislocation pile-up formation. Using this hypothesis of dislocation blocking, estimates of when blocking should occur can be made.

Figure 6:
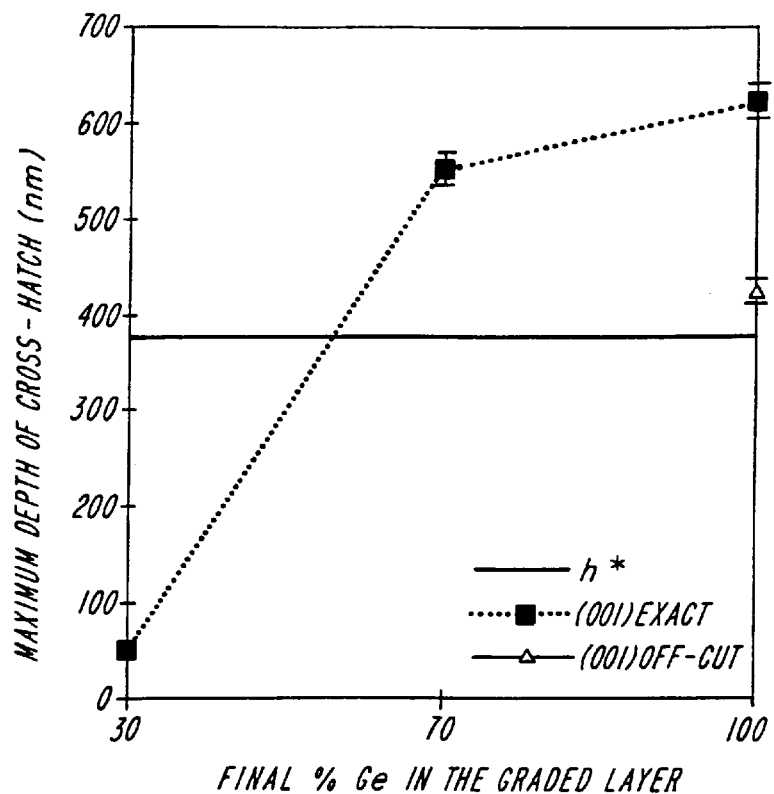
FIG. 6 is a graph showing the variation of maximum trench depth of surface cross-hatch pattern with increase in final Ge % in the graded layer.

FIG. 6 is a graph showing the variation of maximum trench depth of surface cross-hatch pattern with increase in final Ge % in the graded layer. The maximum depth of a surface trench from the cross hatch pattern increases with increase in final Ge % of the graded region as shown in FIG. 6. The value of h* for 10% Ge/$\mu$m grading rate is also plotted on the same graph. It will be appreciated that h* is a function of grading rate only and not of the final Ge % of the graded region. In cases where the maximum trench depth is higher than h*, dislocation pile-ups can be expected. The farther above the "maximum trench depth" point is from the h* line, the more trenches can block dislocations and hence create dislocation pile-ups. For each Ge grading rate, a plot such as FIG. 6 can be constructed. Such plots would allow one to predict the likelihood of dislocation pile-up formation in graded structures. The above analysis, though demonstrated for graded Si—Ge/Si structures, is applicable to any graded lattice-mismatched heteroepitaxial system.

Figure 7:
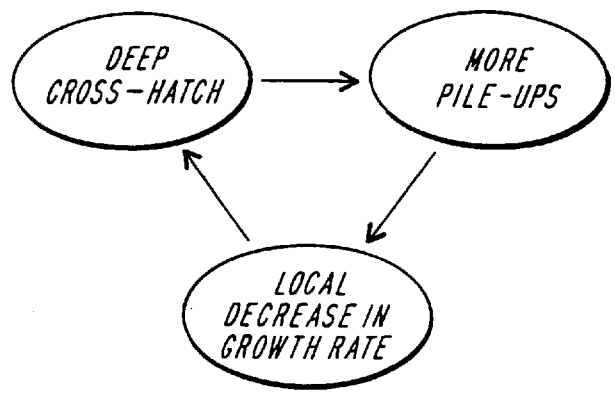
FIG. 7 is a schematic diagram illustrating the nature of interactions between surface morphology and dislocation pile-ups.

As previously described, the dislocation pile-up formation can affect, e.g. the degradation of, surface morphology as well. Threading segments of gliding dislocations terminate on the trench side-walls at a dislocation pile-up. The surface sites at or near the trench side-walls where the dislocations terminate are energetically unfavorable sites for atoms diffusing on the growth surface. This reduces the growth rate along the trench side-walls as compared to growth of the average surface. Such an effect increases the trench depths, making more gliding dislocations prone to blockage. The vicious nature of the interactions of the surface morphology and dislocation pile-up formation is summed up in a schematic sketch of FIG. 7.

Figure 8:
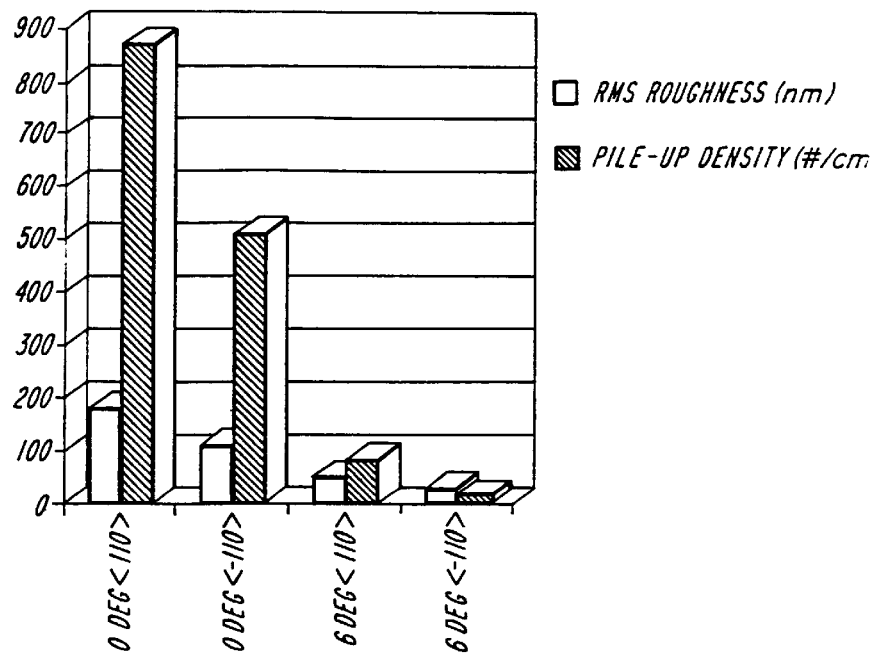
FIG. 8 is a bar graph showing the correlation between the observed rms roughness and dislocation pile-up density along the two in-plane <110> directions for Ge/Ge$_x$Si$_{1-x}$/Si samples graded up to 100% Ge grown on the on-axis exact (001) and 6° off-cut (001) Si substrates.

A correlation between rms roughness and dislocation pile-up density for Ge/Ge$_x$Si$_{1-x}$/Si(001) samples, as shown in FIG. 8, along the two in-plane <110> directions agrees with the above analysis. FIG. 8 shows a graph of the correlation between the observed rms roughness and dislocation pile-up density along the two in-plane <110> directions for Ge/Ge$_x$Si$_{1-x}$/Si samples graded up to 100% Ge grown on the on-axis exact (001) and 6° off-cut (001) Si substrates. It was found that a high rms roughness was associated with a high dislocation pile-up density for a given direction on the sample surface.

With reference back to FIG. 2, the effect of increasing final Ge content of the graded layer on the rms roughness of the top surface in Ge$_x$Si$_{1-x}$/Si films is shown. Since all the graded layers were grown at 10% Ge/$\mu$m, different final Ge contents indicate that the graded regions in each structure have different thicknesses as well. With the increase of Ge content of the graded region, the rms roughness increases. This behavior was also observed for Ge$_x$Si$_{1-x}$/Si samples grown using molecular beam epitaxy (MBE). It is seen in FIG. 2 that beyond 70% Ge, however, the rms roughness seems to increase at a slower rate. This decrease in roughening at higher Ge concentration is related to a change in the buried dislocation network. Edge type dislocations with in-plane Burgers vectors to the type ½<110> and ½<$\bar{1}$10> form in high Ge region of the graded buffer layer, influencing the residual strain fields at the surface.

It is seen in FIG. 2 that the rms roughness for the 100% Ge sample grown on a Si(001) 6° off-cut substrate is drastically reduced. The reduced roughness is probably related to the lower pile-up density and anisotropic growth rates of crystal surfaces. It has been shown that the growth rate for Si surfaces is highest for {001}, lowest for {111} and intermediate for {110}. The cross hatch pattern can lead to the formation of planes tilted away from (001) growth surface (along the trenches). The surfaces oriented off the (001) have slower growth rates; thus a large differential in growth rates encourages even greater changes in growth rate, forming facets on the surface.

Growth on a substrate that is miscut toward <110> implies that the difference in the growth rates along the trench side-walls and the average growth surface is less compared to growth on an exact (001) surface. Over long periods of growth, the reduced growth rate anisotropy in the miscut wafer case could translate into reduced rms roughness of the growth surface. The above proposition could also explain the anisotrophy of rms roughness along the two in-plane <110> directions for the off-cut sample. The in-plane <110> direction towards which the substrate was miscut showed a lower rms roughness than the orthogonal in-plane <110> direction, as shown in FIG. 8.

Another effect that might be partially responsible for the reduced rms roughness in the off-cut samples is the ease of formation of the edge dislocations with in-plane Burgers vectors. Such dislocations, as explained before, do not produce as severe strain field inhomogeneities at the growth surface as the mixed 60° dislocation. In addition, if only edge type dislocations are present, the strain fields from the neighboring dislocations will quickly annihilate, thus creating less residual strain fields at the surface of the growing epilayer. The edge dislocations are more easily formed on the off-cut substrate than the exact oriented one, therefore contributing to a lower rms roughness for same samples grown on off-cut substrates.

Figure 9A:
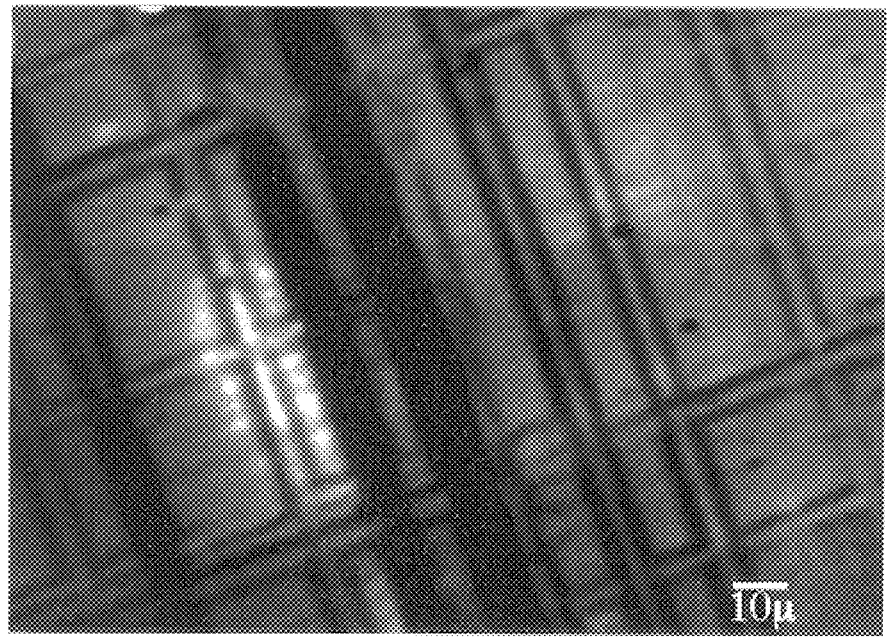
FIGS. 9A and 9B are plan view EBIC images of Ge/Ge$_x$Si$_{1-x}$/Si samples graded up to 100% Ge grown on Si(001) exact and Si(001) 6° off-cut towards <110> Si substrates, respectively.
Figure 9B:
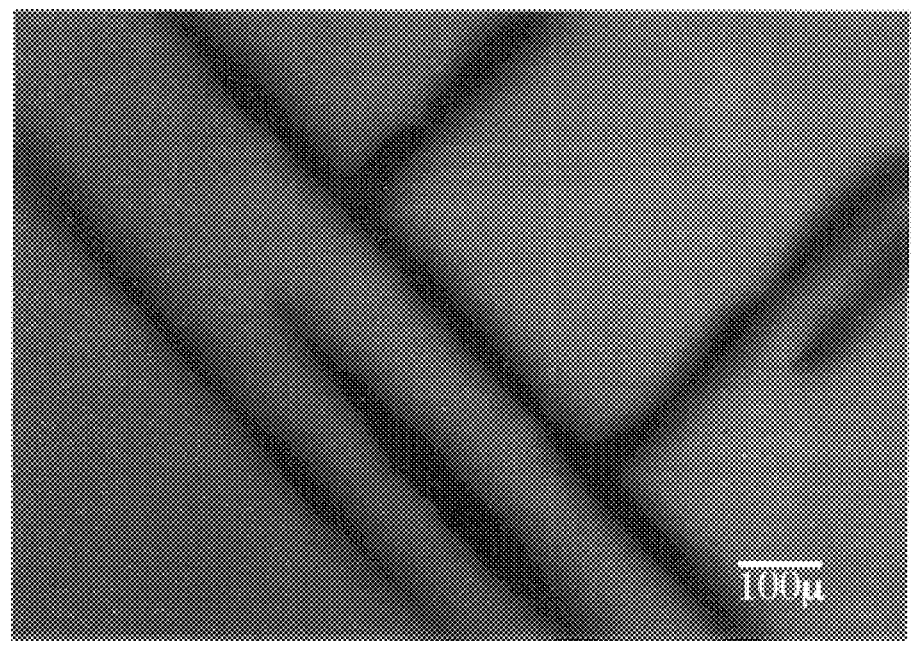

FIGS. 9A and 9B are plan view EBIC images of Ge/Ge$_x$Si$_{1-x}$/Si samples graded up to 100% Ge grown on Si(001) exact and Si(001) 6° off-cut towards <110> Si substrates, respectively. The images illustrate the drastic reduction in dislocation pile-up density for the sample grown on the off-cut substrate. For the sample grown on the off-cut substrate, there is a clear anisotropy in the density of pile-ups along the two in-plane <110> directions.

The plot of FIG. 6 predicts that the samples graded up to 70% Ge and 100% Ge would form dislocation pile-ups. It was found to be true for the 100% Ge samples grown on Si(001) and Si(001) off-cut substrates, as shown in FIGS. 9A and 9B. There is a substantial reduction in dislocation pile-up density in the 100% Ge sample grown on an off-cut substrate. As previously described, growth on an (001) off-cut substrate results in reduced surface roughness and reduced trench depths. In FIG. 6, the "maximum trench depth" point for the off-cut sample is close to the h* line indicating that there are only a few deep trenches that can cause dislocation blocking. Hence, it is not surprising that the dislocation pile-up density is extremely low for growth on the off-cut substrate. As shown in FIG. 8, there was a clear anisotropy in the dislocation pile-up density along the two in-plane <110> directions in case of the 100% Ge sample grown on an off-cut substrate. The anisotropy in dislocation pile-up density is related to the anisotropy or rms roughness previously described. Anisotrophy in surface roughness and dislocation pile-up density of a much lesser degree is also observed in the 100% Ge (001) exact oriented sample. This anisotrophy is probably related to unintentional miscut in the substrate.

Figure 10:
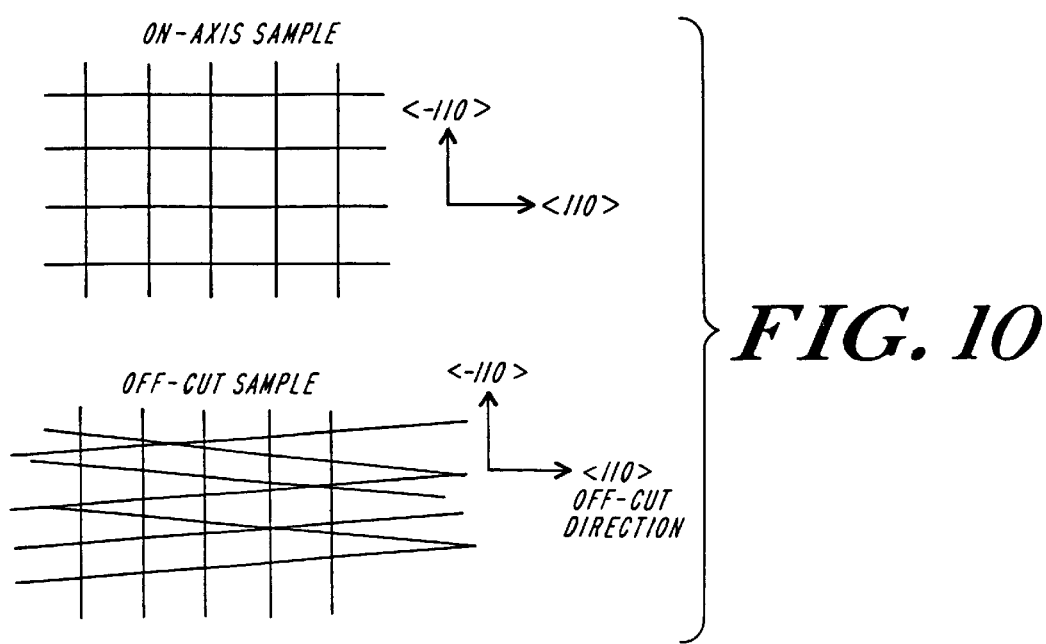
FIG. 10 is a schematic plan view of the 60° dislocation network on an on-axis substrate and a substrate off-cut towards the <110> direction.

It has been observed that in InGaAs layers grown on (001) off-cut (2° towards (010)) GaAs substrates, the 60° misfit dislocations did not lie exactly along the in-plane <110> directions. Two 60° dislocations with the same line direction, but gliding on different {111} planes would intersect each other due to the substrate miscut. This suggests another factor which would reduce pile-up densities in samples grown on off-cut wafers. FIG. 10 is a schematic plan view of the 60° dislocation network on an on-axis and a wafer off-cut towards the <110> direction. Since the 60° dislocations are not parallel, a nucleation source cannot create long lines of parallel dislocations with the same Burgers vector. Thus, the dislocation contribution to the blocking picture, as shown in FIG. 5, is changed since a long wall of blocking stress fields is not created. In exemplary growth experiments, the above proposition would be true only along one of the two <110> directions, since the miscut was towards a <110> direction. This also seems to explain the anisotropy of pile-ups along the <110> directions in the miscut sample.

Figure 11A:
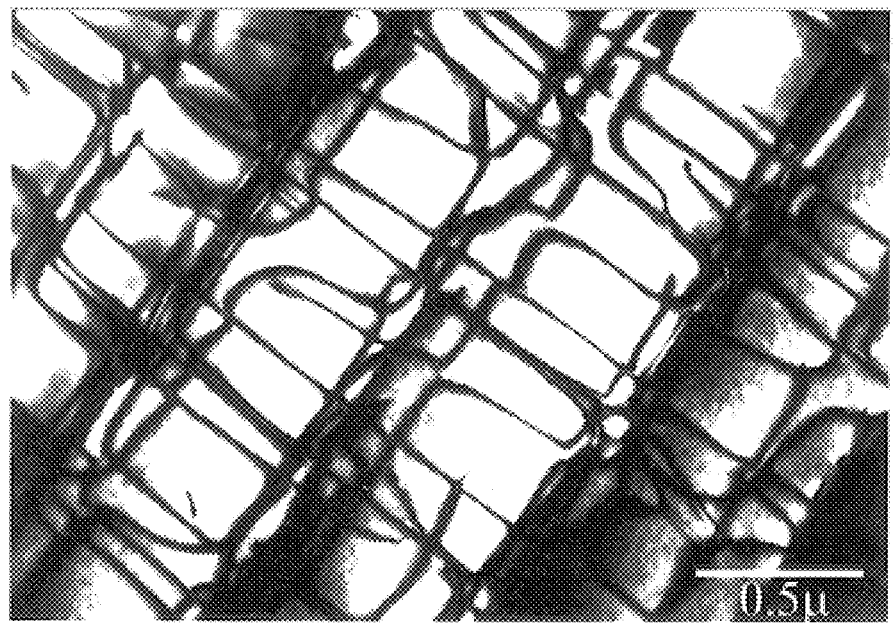
FIG. 11A is a plan view TEM micrograph showing the dislocation structure in the Si-rich graded region of a Ge/Ge$_x$Si$_{1-x}$/Si(001) sample.
Figure 11B:
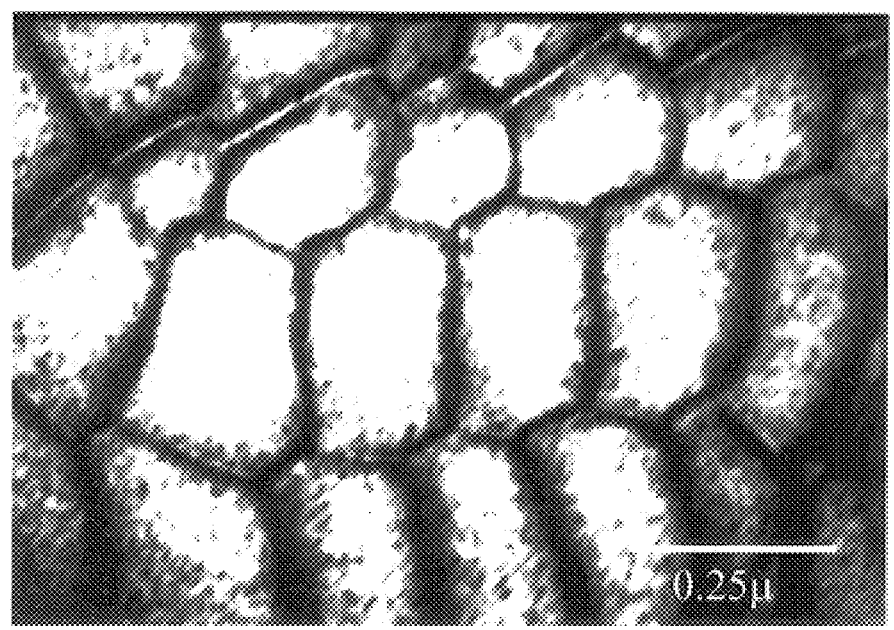
FIG. 11B is a plan view TEM micrograph of a novel and unexpected hexagonal dislocation structure in the Ge rich region of a similar structure as in FIG. 11A.

The dislocation structure in the Ge/Ge$_x$Si$_{1-x}$/Si samples was observed using plan view TEM. FIG. 11A is a plan view TEM micrograph showing the dislocation structure in the Si-rich graded region of a Ge/Ge$_x$Si$_{1-x}$/Si(001) sample. An array of primarily 60° dislocations running along the two in-plane orthogonal <110> directions was observed. FIG. 11B is a plan view TEM micrograph of a novel and unexpected hexagonal dislocation structure in the Ge rich region of a similar structure as in FIG. 11A. The array of 60° dislocations, which formed initially, reacted to form a lower energy hexagonal network of dislocations. A "g.b" analysis of the dislocation structure in FIG. 11B was performed to determine the Burgers vectors of the dislocations that made up the hexagonal network.

Figure 12A:
FIGS. 12A to 12D are plan view TEM micrographs showing the aforementioned analysis from the same area, but using different g beams for Burgers vector analysis of the hexagonal network to form the image.
Figure 12B:
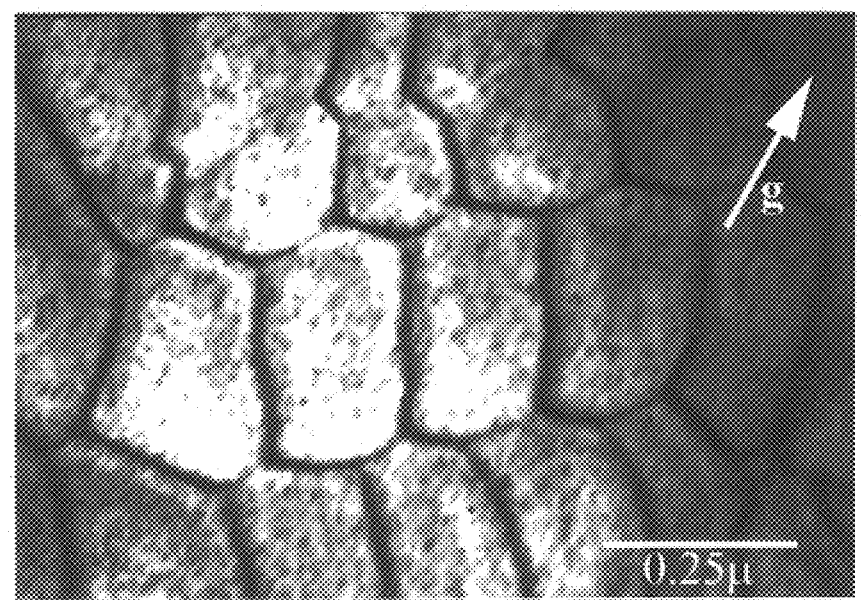
Figure 12C:
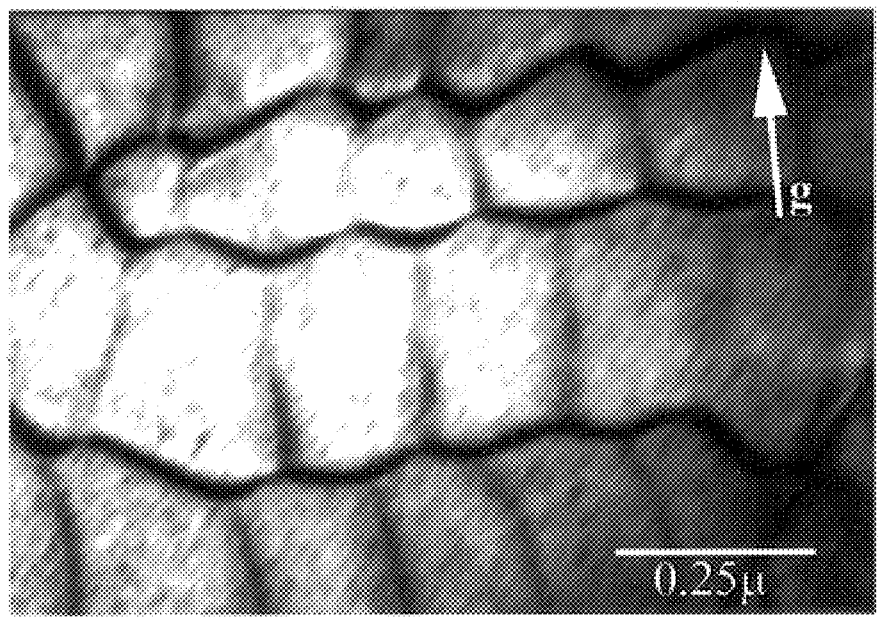
Figure 12D:
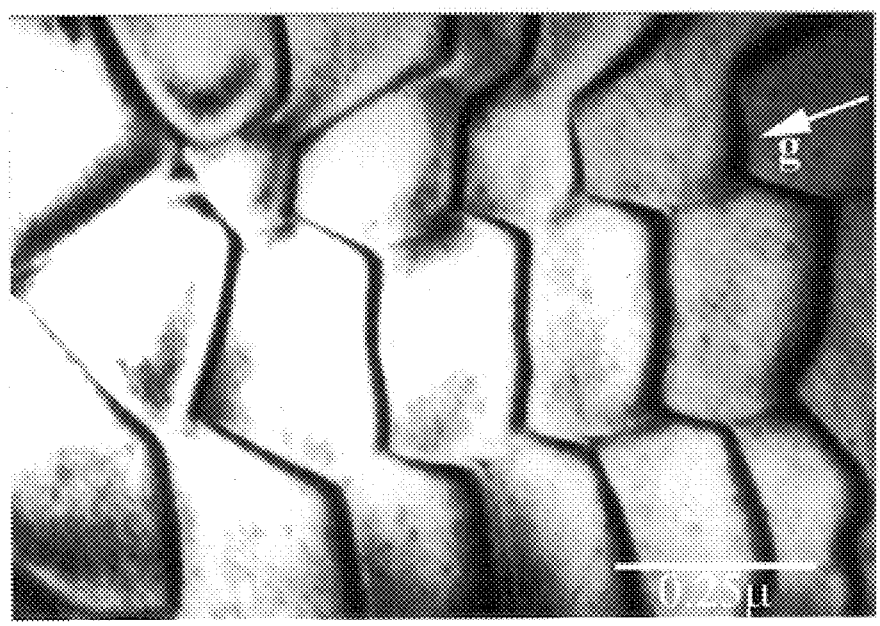

FIGS. 12A to 12D are plan view TEM micrographs showing the aforementioned analysis from the same area, but using different g beams for Burgers vector analysis of the hexagonal network to form the image. It was found that the entire hexagonal network was made up of dislocations with in-plane Burgers vectors of the type ½<110>, ½<$\bar{1}$10>and <100>. In FIG. 12A g=040, in FIG. 12B g=400, in FIG. 12C g=220, and in FIG. 12D g=−220.

It is well known that low-mismatch, graded Si—Ge(001) structures typically relax by the formation of 60° dislocations that glide down the various {111} planes to the (001) interface. The straight misfit segments of the 60° dislocations that relieve misfit lie along the two in-plane <110> directions at the (001) interface. FIG. 11A shows one such array of 60° dislocations existing in a (001) interface in the Si-rich region of the graded Si—Ge structure. FIG. 11B shows a similar TEM micrograph taken from the Ge-rich region of the graded structure grown on a (001) off-cut substrate. A hexagonal network of dislocations is observed. A "g.b" analysis of the network in FIG. 11B, as shown in FIGS. 12A–12D, revealed that it was made up of dislocations of the type ½<110>, ½<$\bar{1}$10> and <100>. Each node in the hexagonal network is formed by a <110> edge type dislocation and two reacting ½<110> edges. Such dislocation networks have also been observed in bulk silver bromide (AgBr) and potassium chloride (KCl) crystals. To date, such a dislocation structure has not been observed in heteroepitaxial thin film growth.

Two 60° dislocations with Burgers vectors of the type ½<110> and ½<011> can glide out of the (001) interface and react to form an edge dislocation of the type ½<110>. Such reactions are favored since there is a large reduction in strain energy involved (b$^2$ criterion). These edge dislocations, lying in the (001) planes are sessile and can only travel further only by climb mechanisms. As the Ge content of the graded layer increases, the melting point of the Ge$_x$Si$_{1-x}$ alloy decreases (T$_{m,Si}$≈1425° C., T$_{m,Ge}$≈940° C.). Hence, as growth of the graded layer proceeds, the difference between the growth temperature and the melting temperature decreases.

Vacancy diffusion increases as the growth temperature approaches the melting point and hence climb mechanisms, which are primarily vacancy diffusion based, become significant too. Thus, the sessile edge dislocations can climb out of the (001) interface more easily as the Ge content of the graded layer increases and react. Edge dislocations of the type ½<110> (formed by reactions between 60° dislocations) can further react as shown:

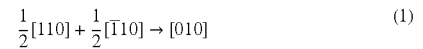

Such reactions, though energetically neutral from an elastic theory view point, are favored since it leads to energy lowering due to the sharing of atomic misfit in the dislocation cores. Very little external driving force is required for such reactions to proceed. In an orthogonal dislocation grid made up of dislocations of the kind ½<110> and ½<$\bar{1}$10>, reactions such as equations (1) and (2) can lead to a hexagonal network as observed in FIG. 11B. Since all the Burgers vectors of the network lie in the (001) plane, they are 100% efficient in relieving the misfit strain unlike the 60° dislocation which are only 50% as efficient. Such a dislocation network is probably the lowest energy configuration that can evolve from the array of 60° dislocations that forms initially. In the high Si regions of the graded Si—Ge structure, the difference in the growth temperature and the melting point of the alloy is large and therefore the atomic mobility is low. In this case, dislocation reactions are limited due to lack of dislocation climb. This could explain why the low energy hexagonal network of dislocations does not form in regions of high Si content in the graded structure, as shown in FIG. 11A.

TEM observations of the graded regions for exemplary samples grown on exact (001) orientation revealed that the hexagonal network of dislocations do not form as easily as on the off-cut substrate. The substrate off-cut somehow seems to facilitate the dislocation reactions necessary for the hexagonal network to form. It has been observed that in InGaAs layers grown on (001) off-cut (2° toward (010)) GaAs substrates, two 60° dislocations gliding on different {111} planes would intersect since their line directions on the (001) plane were off exact <110> direction. On exact (001) substrates, these dislocations would lie exactly along a <110> direction parallel to each other. Such intersections of 60° dislocations were favorable in their reaction to form an edge type dislocations. Thus, the off-cut of the substrate increases the probability that a 60° dislocation would find the right 60° to react with. Thus, for samples on the off-cut substrates it would be easier for the ½<110> types edge dislocations to form. The presence of more ½<110> type edge dislocations implies that more reactions as shown in equations (1) and (2) could occur, and hence it is easier to form the low energy hexagonal network of dislocations. For samples grown on the (001) exact substrate, the formation of ½<110> type edges is more difficult, and hence formation of <110> dislocations is more difficult.

The new dislocation structure offers new degrees of freedom in designing relaxation processes. The 60° dislocations are advantageous, since their introduction can be controlled at relatively low temperatures. However, it now appears that the subsequent elimination of the "extra" Burgers vector components is possible.

Accordingly, the origin of dislocation pile-up formation and surface roughness in graded Ge/Ge$_x$Si$_{1-x}$/Si layers has been investigated. The effect of substrate off-cut on surface morphology, dislocation pile-up formation and the dislocation structure was studied as well. Dislocation pile-ups originate from a combination of dislocation interaction and the effect of surface morphology. The exemplary samples grown on (001) off-cut substrates showed reduced surface roughness and a low dislocation pile-up density as compared to samples grown on (001) exact oriented substrates. A model was proposed to explain the formation of dislocation pile-ups in graded structures. Applying both dislocation blocking criterion and the impact of surface morphology to gliding dislocations, and studying the effect of maximum trench depth of the cross hatch pattern, it was possible to predict the likelihood of dislocation pile-up formation. Off-cut wafers decrease the chance of dislocation pile-up formation, leading to lower pile-up densities and smoother surfaces. Additionally, reduced roughness is expected due growth rate anisotrophy and the ease of formation of edge dislocation (that are less effective in inducing inhomogeneous strain fields at the surface).

TEM studies revealed the presence of a novel hexagonal dislocation network consisting of edge dislocations with Burgers vectors of the types ½<110>, ½<$\bar{1}$10> and <110> in the Ge-rich regions of the graded structure. The atomic mobility in the Ge-rich alloys is higher since the growth temperature is closer to the melting point. This facilities the dislocation climb reactions necessary for the hexagonal network formation. In the off-cut samples favorable intersections of the right kinds 60° dislocations aided the formation of ½<110> type edge dislocations, and hence the <110> type as compared to exact oriented samples. The new dislocation structures offer to explore new processes which may eliminate spatially variant strain fields in relaxed epitaxial layers and reduce threading dislocation densities.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of processing semiconductor materials, comprising:
   providing a monocrystalline substrate of a first semiconductor material having an orientation from 1° to about 8° offset from the [001] direction; and
   epitaxially growing a relaxed graded layer of a crystalline second semiconductor material on said substrate, said second semiconductor material including at least said first semiconductor material, and thus forming a semiconductor surface of the relaxed graded layer that has a dislocation pile-up density less than 60 per centimeter, and a threading dislocation density lower than $3\times10^6$ cm$^{-2}$ and a root-mean square surface roughness of less than 20 nm.

2. The method of claim 1 further comprising epitaxially growing a layer of a third semiconductor material on said graded layer.

3. The method of claim 1, wherein said first semiconductor material comprises silicon.

4. The method of claim 1, wherein said second semiconductor material comprises GeSi.

5. The method of claim 2, wherein said third semiconductor material is selected from the group consisting essentially of Ge, GaAs, and GaInP.

6. The method of claim 2, wherein said third semiconductor material comprises a III–V semiconductor material.

7. The method of claim 1, wherein the degree of relaxation of said relaxed graded layer is from about 70% to 100%.

8. The method of claim 1, wherein said epitaxially growing step further comprises epitaxially growing said second semiconductor material designated as A$_x$B$_{1-x}$ at a temperature ranging between about 650° C. and about 1300° C. while increasing the content of A at a gradient of less than about 25% per micrometer to a final composition in the range $0.1 \leq x \leq 1.0$, where B comprises said first semiconductor material.

9. The method of claim 8, wherein said temperature is the range between about 750° C. and about 1000° C.

10. The method of claim 1, wherein said substrate is offset towards the [110] direction.

11. The method of claim 1, wherein the surface of said relaxed graded layer has lowered defect density and improved surface morphology.

12. A method of processing semiconductor materials, comprising:

providing a monocrystalline substrate of a first semiconductor material having an offcut from 2° to about 6° offset from the [001] direction; and epitaxially growing a relaxed graded layer of crystalline second semiconductor material on said substrate, said second semiconductor material including at least said first semiconductor material, and thus forming a semiconductor surface of the relaxed graded layer that has a lower dislocation pile-up density less than 60 per centimeter, and a threading dislocation density lower than $3\times10^6$ cm$^{-2}$ and a root-mean-square surface roughness of less than 20 nm.

13. A semiconductor structure, comprising:

a monocrystalline silicon substrate having a (001) crystallographic surface orientation, said substrate being off-cut to an orientation from 2° to about 6° offset towards the [110] direction; and a relaxed graded layer of a crystalline GeSi which is epitaxially grown on said substrate, wherein a semiconductor surface of the relaxed graded layer has a dislocation pile-up density less than 60 per centimeter, and a threading dislocation density lower than $3\times10^6$ cm$^{-2}$ and a root-mean-square surface roughness of less than 20 nm.

* * * * *